United States Patent
Maruyama

(10) Patent No.: US 10,784,176 B1
(45) Date of Patent: Sep. 22, 2020

(54) SEMICONDUCTOR DEVICE AND SEMICONDUCTOR DEVICE MANUFACTURING METHOD

(71) Applicant: FUJI ELECTRIC CO., LTD., Kawasaki-shi, Kanagawa (JP)

(72) Inventor: Rikihiro Maruyama, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/801,781

(22) Filed: Feb. 26, 2020

(30) Foreign Application Priority Data

Apr. 12, 2019 (JP) .................. 2019-076457

(51) Int. Cl.
*H01L 23/049* (2006.01)
*H01L 21/48* (2006.01)
*H01L 23/10* (2006.01)

(52) U.S. Cl.
CPC ........ *H01L 23/049* (2013.01); *H01L 21/4817* (2013.01); *H01L 23/10* (2013.01)

(58) Field of Classification Search
CPC .................................................... H01L 23/049
See application file for complete search history.

(56) References Cited

U.S. PATENT DOCUMENTS

| | | | |
|---|---|---|---|
| 4,514,587 A * | 4/1985 | Van Dyk Soerewyn | H01L 23/049 174/551 |
| 4,530,003 A * | 7/1985 | Blair | H01L 23/049 257/672 |
| 6,396,125 B1 * | 5/2002 | Soyano | H01L 23/16 257/47 |
| 8,198,712 B2 * | 6/2012 | Zhuang | H01L 23/04 257/678 |
| 8,405,205 B2 * | 3/2013 | Takahashi | H02M 7/003 257/724 |
| 8,975,740 B2 * | 3/2015 | Horie | H01L 25/072 257/693 |
| 9,941,255 B2 * | 4/2018 | Nakashima | H01L 23/645 |
| 2001/0038143 A1 | 11/2001 | Sonobe et al. | |
| 2004/0056349 A1 * | 3/2004 | Yamada | H01L 23/49562 257/724 |
| 2014/0225238 A1 * | 8/2014 | Kimura | H01L 23/3107 257/666 |

(Continued)

FOREIGN PATENT DOCUMENTS

JP    H03-261837 A    11/1991
JP    H11-68035 A    3/1999

(Continued)

*Primary Examiner* — Hung V Ngo
(74) *Attorney, Agent, or Firm* — Rabin & Berdo, P.C.

(57) ABSTRACT

A case of a semiconductor device has sidewall portions which surround sides of a metal substrate along the sides and a coating portion which covers the front surface of the metal substrate surrounded by the sidewall portions and which has through ring holes corresponding to fixing holes. Protrusions are formed on inner surfaces of the sidewall portions opposed to one another in plan view with the ring holes therebetween. The metal substrate is inserted in this way into an area surrounded by the sidewall portions of the case and is reliably fixed. Furthermore, alignment is performed with accuracy between each fixing hole of the metal substrate inserted in this way and its corresponding ring hole of the case.

20 Claims, 13 Drawing Sheets

(56) References Cited

U.S. PATENT DOCUMENTS

| | | | | |
|---|---|---|---|---|
| 2014/0284786 | A1* | 9/2014 | Fukuyoshi | H01L 24/34 |
| | | | | 257/712 |
| 2016/0353590 | A1* | 12/2016 | McPherson | H01L 21/4817 |
| 2018/0337153 | A1 | 11/2018 | Uezato | |
| 2019/0229031 | A1* | 7/2019 | Takahashi | H01L 23/3107 |
| 2020/0052420 | A1* | 2/2020 | Mitsumoto | H01L 23/10 |

FOREIGN PATENT DOCUMENTS

| | | |
|---|---|---|
| JP | 2001-185659 A | 7/2001 |
| JP | 2003-258145 A | 9/2003 |
| JP | 2018-195717 A | 12/2018 |

\* cited by examiner

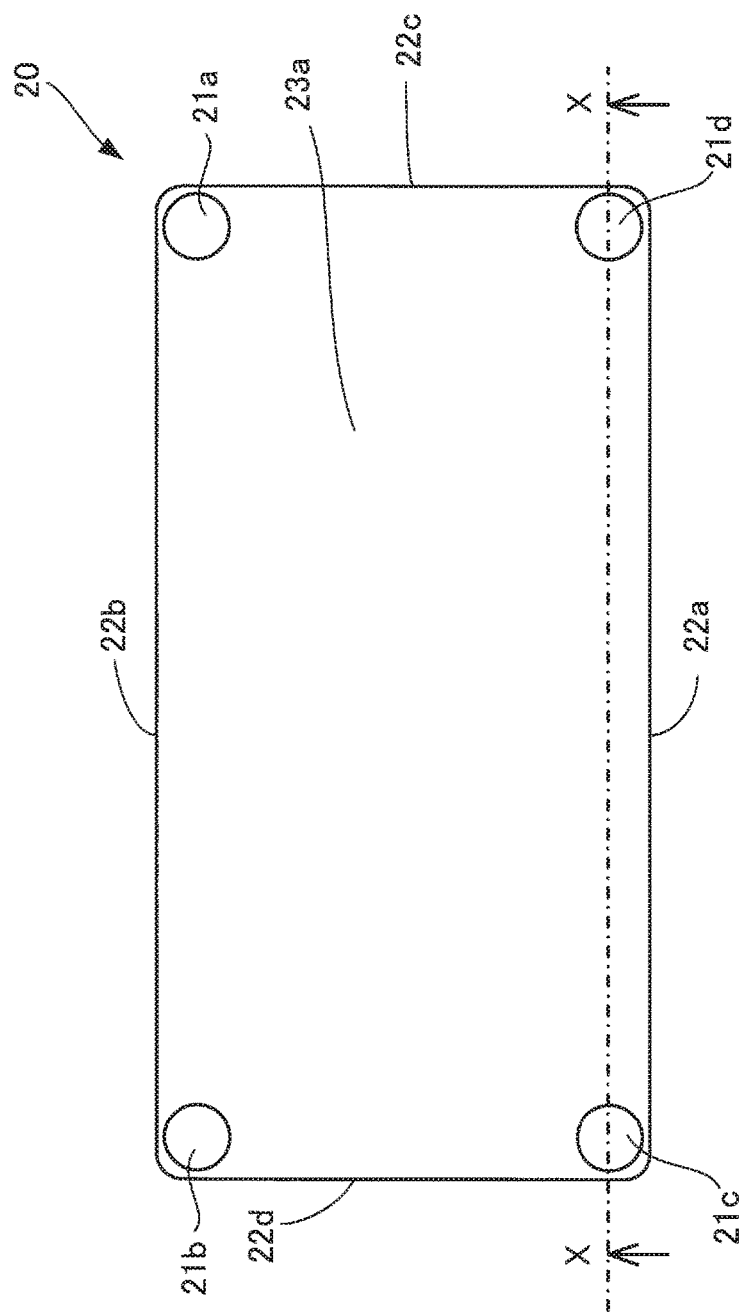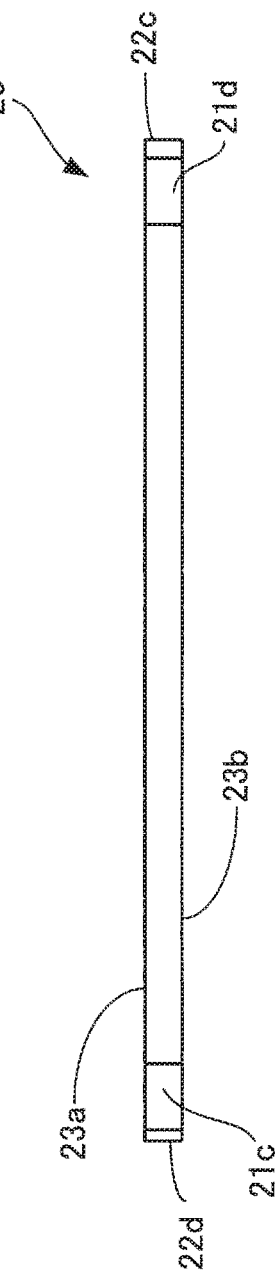
FIG. 2A
FIG. 2B

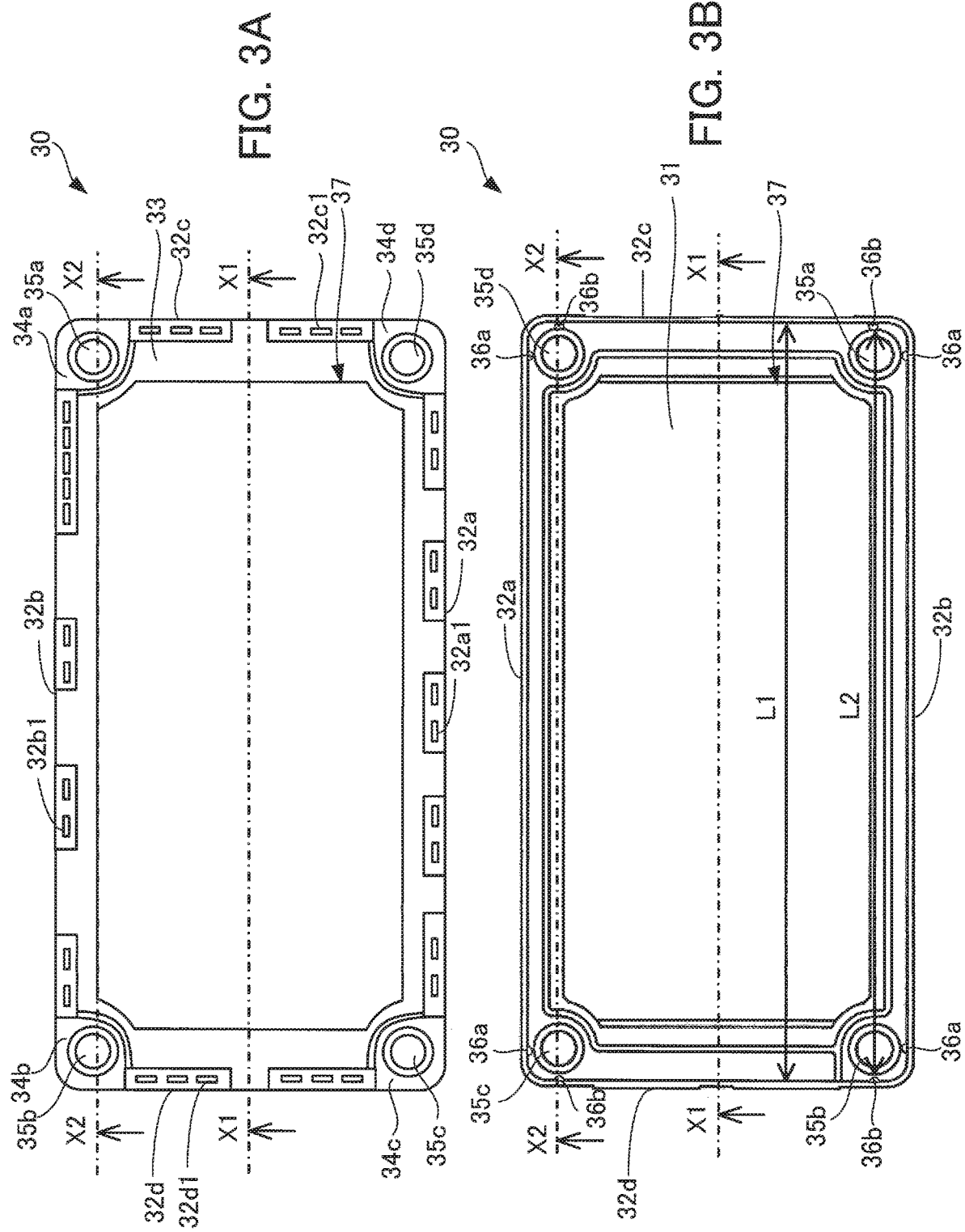

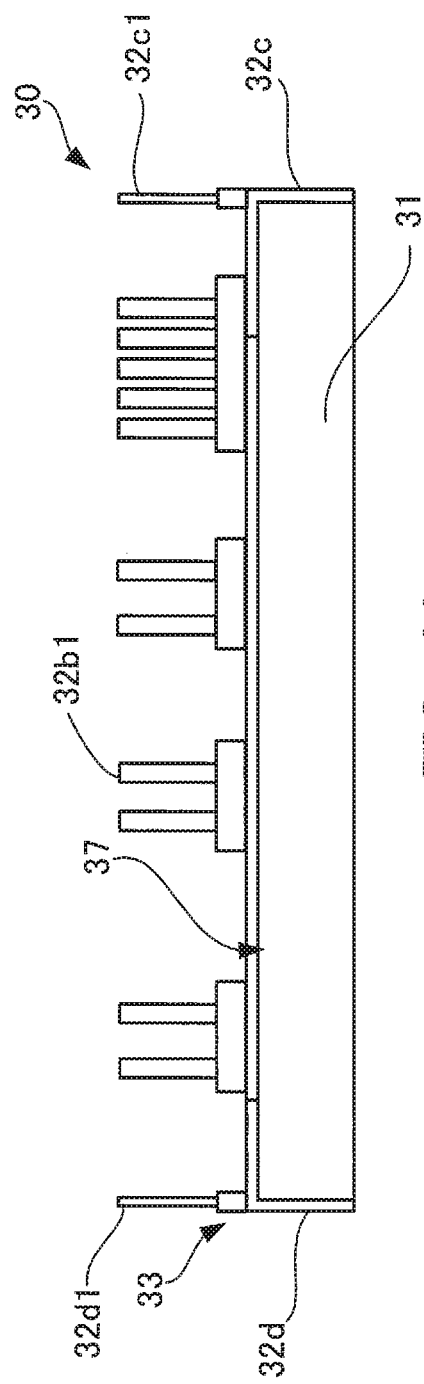
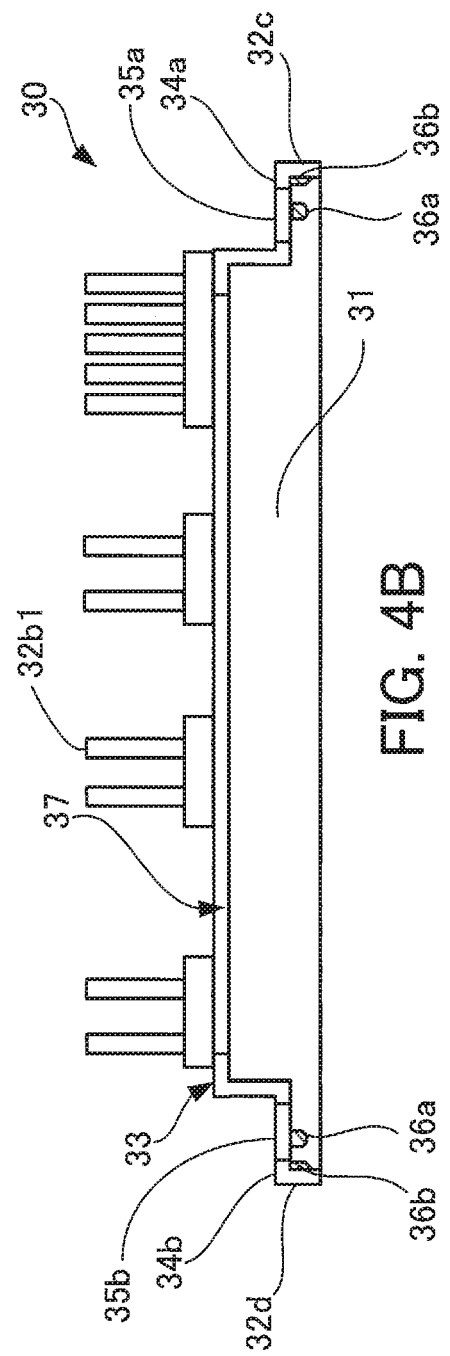

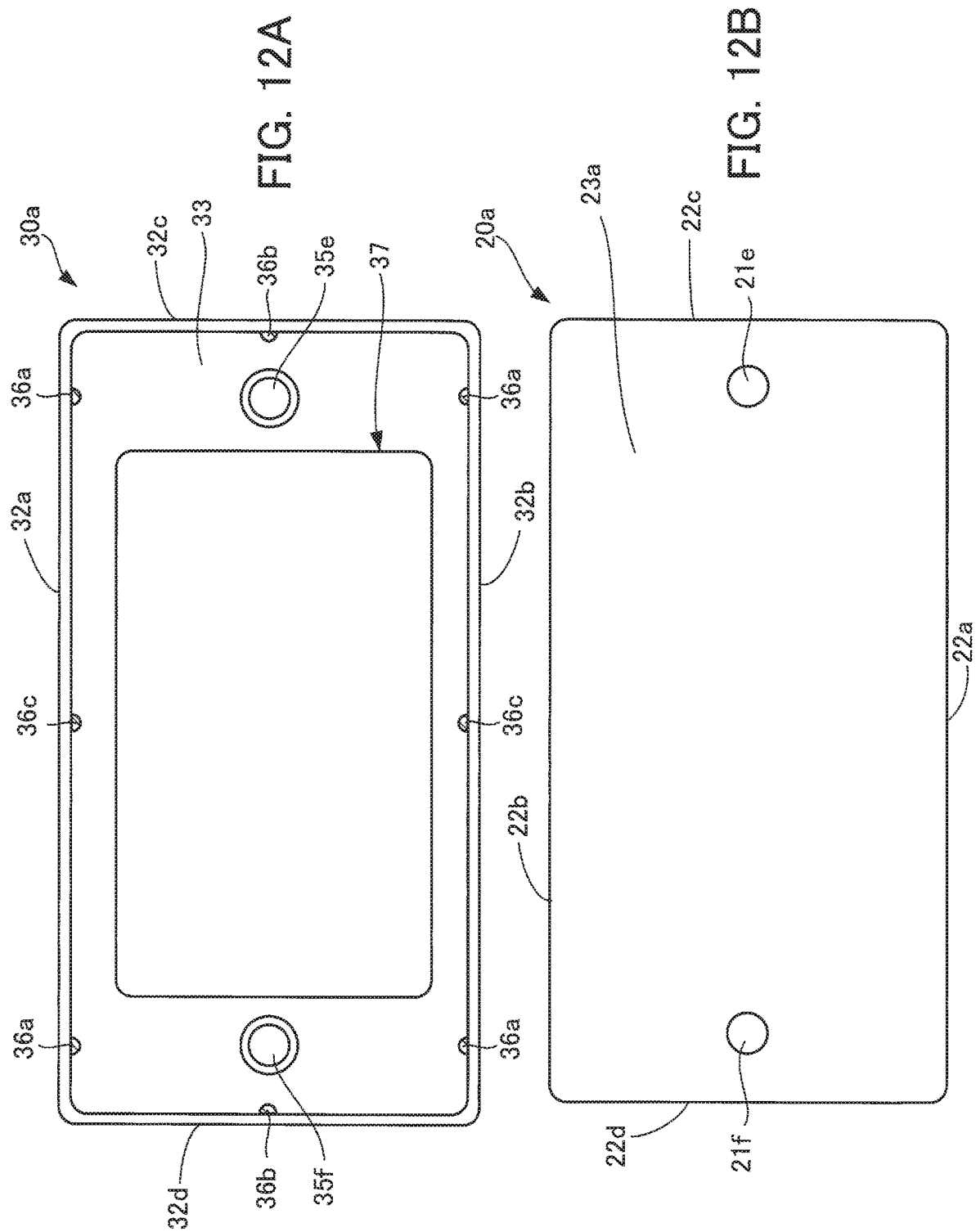

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2019-076457, filed on Apr. 12, 2019, the entire contents of which are incorporated herein by reference.

BACKGROUND OF THE INVENTION

1. Field of the Invention

The embodiment discussed herein relates to a semiconductor device and a semiconductor device manufacturing method.

2. Background of the Related Art

For example, a semiconductor device includes semiconductor elements such as an insulated gate bipolar transistor (IGBT), a power metal oxide semiconductor field effect transistor (MOSFET), a freewheeling diode (FWD), and a Schottky barrier diode (SBD). With this semiconductor device, a substrate to which the IGBT and the FWD are bonded is arranged over a metal substrate and a case which covers the IGBT and the like is located over the metal substrate (see, for example, Japanese Laid-open Patent Publication No. 2018-195717).

Furthermore, holes which pierce the case and the metal substrate of the semiconductor device are made. When the metal substrate is fixed to the case, these holes are aligned and function as fastening holes at the time of fixing the semiconductor device to an external device or the like. There may be a slight deviation between each hole in the case and its corresponding hole in the metal substrate as a result of deviation caused by fixing the metal substrate to the case. Even in such a case, ensuring an effective hole diameter is needed for each of the above fastening holes. Accordingly, in order to accommodate deviation, the diameter of the holes made in the metal substrate is made rather large.

However, if there are restrictions on the external size of the metal substrate or the positions of the holes made in the metal substrate, then the diameter of the holes made in the metal substrate is incapable of being made rather large. As a result, if such a metal substrate is fixed to the case, then there is a possibility that an effective hole diameter is not sufficiently ensured for each of the fastening holes at fixing time.

SUMMARY OF THE INVENTION

According to an aspect, there is provided a semiconductor device including a flat-plate metal substrate having a rectangular shape in a plan view, and having a plurality of through fixing holes provided at a periphery thereof, the metal substrate having a front surface and a back surface opposite to the front surface, and a case having a housing space in which the metal substrate is housed, and having a sidewall portion which is provided along each of side faces of the metal substrate so as to surround the metal substrate, the sidewall portion having a plurality of protrusions provided at an inner surface thereof that faces the metal substrate, and protruding from the inner surface toward the metal substrate for positioning of the metal substrate, two of the plurality of protrusions and a corresponding one of the fixing holes located therebetween being aligned in a line parallel to one of the side faces of the metal substrate, and a coating portion which covers the metal substrate and which has a plurality of through ring holes at positions respectively corresponding to positions of the fixing holes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 2A and 2B are views for describing a metal substrate included in the semiconductor device according to the embodiment;

FIGS. 3A and 3B are views for describing a case included in the semiconductor device according to the embodiment (part 1);

FIGS. 4A and 4B are views for describing the case included in the semiconductor device according to the embodiment (part 2);

FIGS. 12A and 12B are views of a case and a metal substrate included in a semiconductor device according to a second modification.

DETAILED DESCRIPTION OF THE INVENTION

Figure 1:
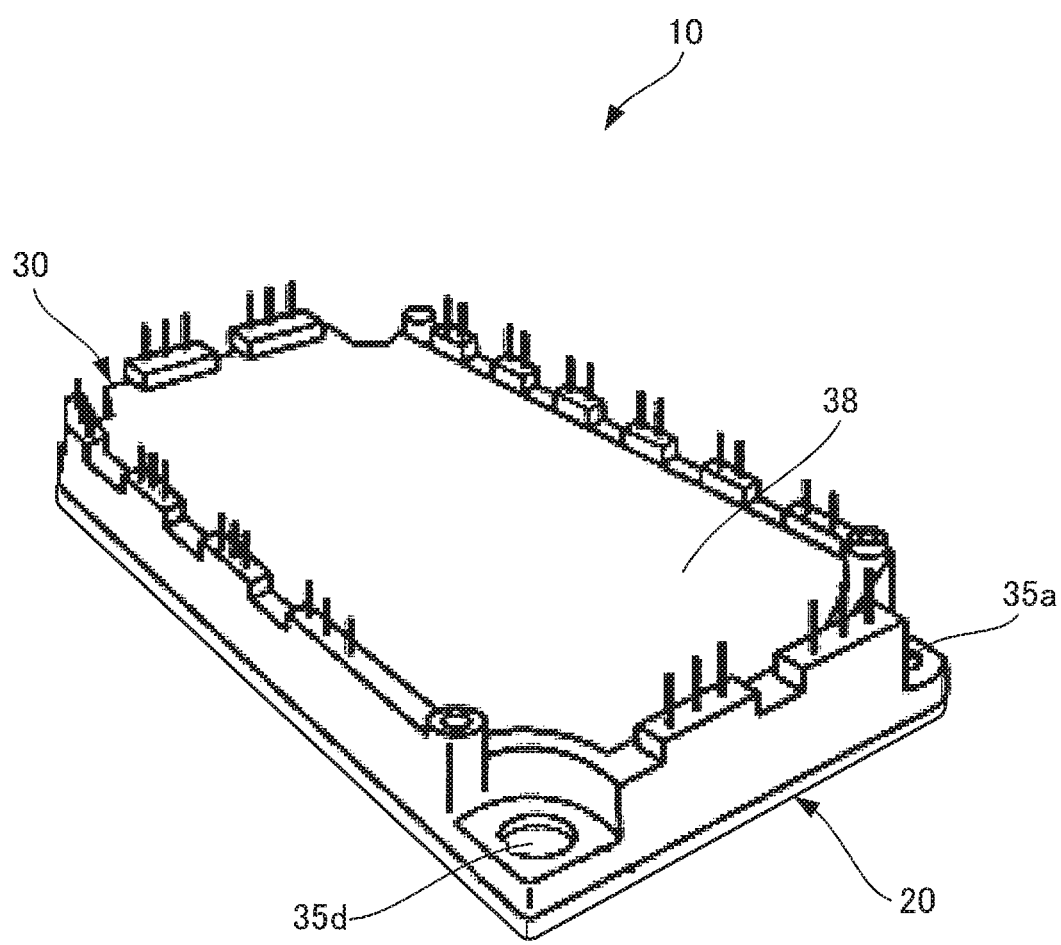
FIG. 1 is a view for describing a semiconductor device according to an embodiment.

A semiconductor device according to an embodiment will now be described with reference to FIG. 1. FIG. 1 is a view for describing a semiconductor device according to an embodiment. In this embodiment, a front surface represents a surface of a semiconductor device 10 of FIG. 1 which faces up and a back surface represents a surface of the semiconductor device 10 of FIG. 1 which faces down. The same applies to the other drawings.

The semiconductor device 10 includes a metal substrate 20, a case 30 which surrounds a semiconductor unit (not illustrated) arranged over the metal substrate 20, and a case lid 38 which covers an aperture portion (not illustrated) of the case 30. Furthermore, ring holes 35a and 35d are made in the four corners of the semiconductor device 10. In FIG. 1, only the ring holes 35a and 35d of the four ring holes are illustrated. A screw is screwed into each of the ring holes 35a and 35d for fastening the semiconductor device 10 to a cooling fin or the like or an external device or the like.

Figure 5A:
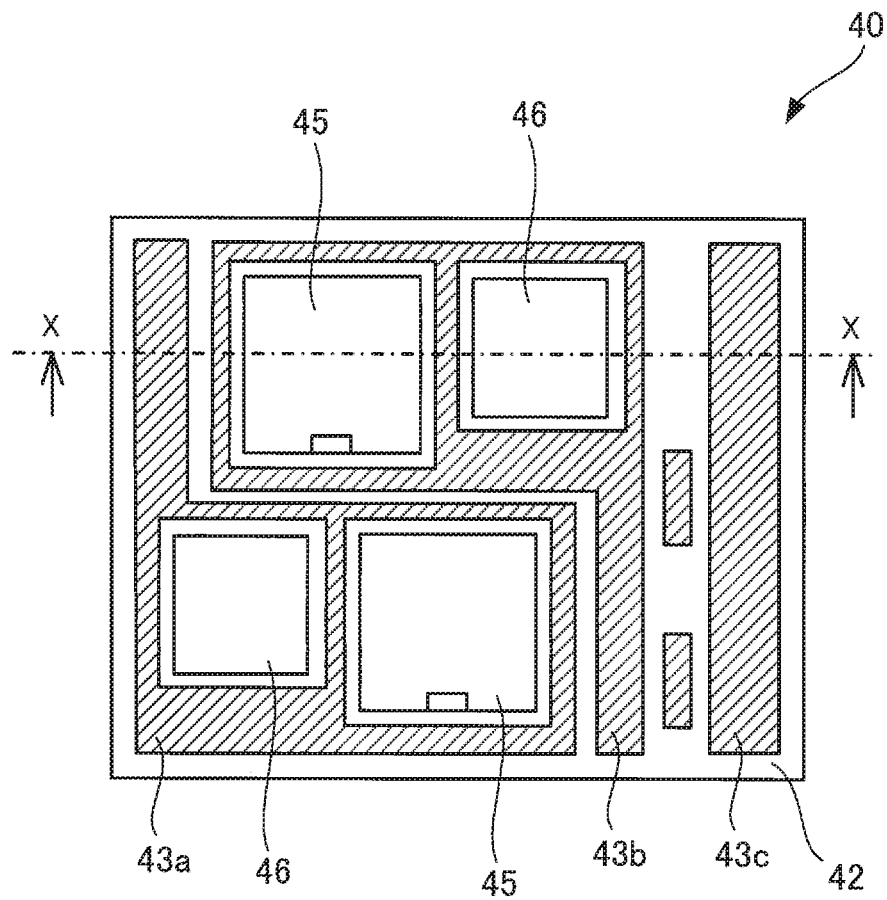
FIGS. 5A and 5B are views for describing a semiconductor unit included in the semiconductor device according to the embodiment.
Figure 5B:
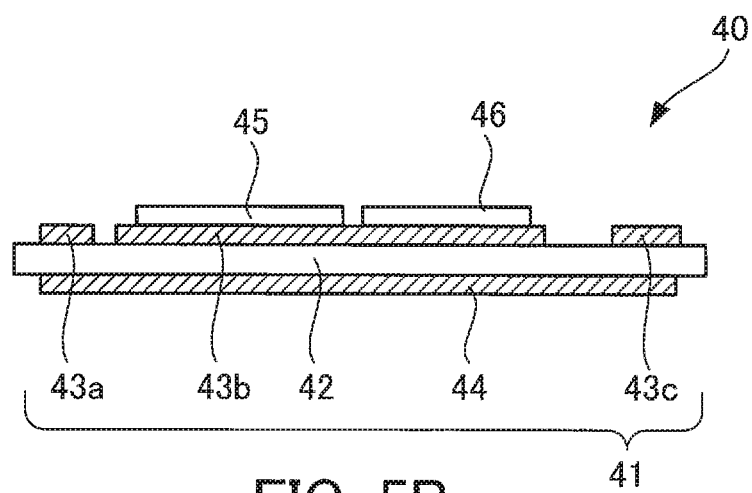

Next, each component of the semiconductor device 10 will be described in detail with reference to FIGS. 2A through 5B. FIGS. 2A and 2B are views for describing the metal substrate included in the semiconductor device according to the embodiment. FIG. 2A is a plan view of the front surface 23a of the metal substrate 20. FIG. 2B is a sectional view taken along the dot-dash line X-X of FIG. 2A. FIGS. 3A and 3B and FIGS. 4A and 4B are views for describing the case included in the semiconductor device according to the embodiment. FIG. 3A illustrates the front surface of the case 30. FIG. 3B illustrates the back surface of the case 30. FIGS. 4A and 4B are sectional views taken along the dot-dash lines X1-X1 and X2-X2, respectively, of FIGS. 3A and 3B. FIGS. 5A and 5B are views for describing a semiconductor unit included in the semiconductor device according to the embodiment. FIG. 5A is a plan view of a semiconductor unit 40. FIG. 5B is a sectional view taken along the dot-dash line X-X of FIG. 5A.

First, as illustrated in FIGS. 2A and 2B, the metal substrate 20 is rectangular in a plan view and has the shape of a flat plate and sides 22a through 22d. Through fixing holes 21a through 21d are made in the periphery of the metal substrate 20. The thickness of the sides 22a through 22d of the metal substrate 20 is preferably greater than or equal to 1 mm and smaller than or equal to 5 mm. For example, the thickness of the sides 22a through 22d of the metal substrate 20 is greater than or equal to 2.8 mm and smaller than or equal to 3.2 mm. The diameter of the fixing holes 21a through 21d is greater than or equal to 5.2 mm and smaller than or equal to 5.8 mm. Furthermore, the metal substrate 20 is made of metal, such as aluminum, iron, silver, copper, or an alloy containing at least one of them, having high thermal conductivity. In addition, in order to improve the corrosion resistance of the metal substrate 20, a layer of metal, such as nickel or gold, may be formed on the surface of the metal substrate 20 by plating treatment or the like. To be concrete, a nickel-phosphorus alloy, nickel-boron alloy, or the like other than nickel and gold may be used. Moreover, gold may be laminated over a nickel-phosphorus alloy. Furthermore, the above metal substrate 20 is obtained from sheet metal by punching. A through hole is made in each corner portion. As a result, the fixing holes 21a through 21d are obtained. In addition, an initial warp may be added in advance to the metal substrate 20 so that a back surface 23b will be convex (downward convex).

As illustrated in FIGS. 3A and 3B and FIGS. 4A and 4B, the case 30 has sidewall portions 32a through 32d and a coating portion 33. As described later, the sidewall portions 32a through 32d have curved surfaces at corner portions so as to correspond to the sides 22a through 22d of the metal substrate 20 and are integrally formed. That is to say, the sidewall portions 32a and 32b correspond to the sides 22a and 22b, respectively, in the long side direction of the metal substrate 20. The sidewall portions 32c and 32d correspond to the sides 22c and 22d, respectively, in the short side direction of the metal substrate 20. The coating portion 33 has the shape of a frame and has an aperture portion 37. That is to say, the coating portion 33 is formed on the sidewall portions 32a through 32d along the sidewall portions 32a through 32d. In the case of FIGS. 3A and 3B, as stated above, the sidewall portions 32a through 32d of the case 30 have the curved surfaces at the corner portions so as to correspond to the sides 22a through 22d of the metal substrate 20. However, another case is possible. If the corner portions of the metal substrate 20 are approximately square, then the corner portions of the sidewall portions 32a through 32d of the case 30 are also approximately square. Furthermore, external connection terminals 32a1 through 32ad extending upward vertically from the front surface of the semiconductor device 10 may be formed on the sidewall portions 32a through 32d respectively.

In addition, the coating portion 33 has ring hole areas 34a through 34d in which through ring holes 35a through 35d respectively are made. As described later, when the metal substrate 20 is fixed to the case 30, the ring hole areas 34a through 34d support the metal substrate 20 so that the metal substrate 20 will not deeply enter the case 30. Furthermore, at this time the ring holes 35a through 35d made in the ring hole areas 34a through 34d are opposed in proximity to the fixing holes 21a through 21d, respectively, of the metal substrate 20. In addition, external connection terminals, which are electrically connected to a semiconductor chip described later, are integrally molded with the coating portion 33 according to necessity. Moreover, when screws are screwed into the ring holes 35a through 35d, metal rings (not illustrated) are fitted into the ring holes 35a through 35d and screws suitable for the diameter of the metal rings are used. Alternatively, rings are not used but screws suitable for the diameter of the ring holes 35a through 35d may be used.

Furthermore, protrusions 36a and 36b are formed on the inner surfaces of the sidewall portions 32a through 32d of the case 30 opposed to one another in plan view with the ring holes 35a through 35d therebetween. The sidewall portions 32a through 32d and the protrusions 36a and 36b may be integrally formed of the same material. For example, the protrusions 36a are formed on the sidewall portions 32a and 32b opposed to each other with the ring hole 35b therebetween. The protrusions 36b are formed on the sidewall portions 32c and 32d opposed to each other with the ring hole 35b therebetween. The protrusions 36a and 36b arranged in this way in plan view with the ring holes 35a through 35d therebetween are formed in parallel areas of the sidewall portions 32a through 32d opposed to one another. In addition, it is assumed that the distance between the sidewall portions 32c and 32d opposed to each other is L1 and that the distance between the protrusions 36b opposed to each other is L2. Then (L1−L2)/2 is preferably greater than or equal to 0.05 mm and smaller than or equal to 0.5 mm. (L1−L2)/2 is more preferably greater than or equal to 0.15 mm and smaller than or equal to 0.3 mm. Moreover, (L1−L2)/2 may be greater than or equal to 1/20 time the thickness of the sides 22a through 22d of the metal substrate 20 and smaller than or equal to 1/10 time the thickness of the sides 22a through 22d of the metal substrate 20. Furthermore, the same applies to the sidewall portions 32a and 32b opposed to each other and the protrusions 36a opposed to each other.

The above case 30 is made of, for example, thermoplastic resin. The sidewall portions 32a through 32d and the coating portion 33 are integrally formed. Polyphenylene sulfide (PPS), polybutylene terephthalate (PBT) resin, polybutylene succinate (PBS) resin, polyamide (PA) resin, acrylonitrile butadiene styrene (ABS) resin, or the like is used as such resin.

Next, as illustrated in FIGS. 5A and 5B, the semiconductor unit 40 includes a ceramic circuit board 41 and semiconductor chips 45 and 46 arranged over the ceramic circuit board 41. The ceramic circuit board 41 has an insulating board 42, a metal plate 44 formed on the back surface of the insulating board 42, and circuit patterns 43a through 43c formed over the front surface of the insulating board 42. The shape and quantity of the circuit patterns 43a through 43c are taken as an example. The insulating board 42 is made of a ceramic, such as aluminum oxide, aluminum nitride, or silicon nitride, having high thermal conductivity. The metal plate 44 is made of metal, such as aluminum, iron, silver, copper, or an alloy containing at least one of them, having high thermal conductivity. The circuit patterns 43a through 43c are formed of metal, such as copper or a copper alloy, having good conductivity. A direct copper bonding (DCB) substrate, an active metal brazed (AMB) substrate, or the like is used as the ceramic circuit board 41 having the above structure. The ceramic circuit board 41 conducts heat generated by the semiconductor chips 45 and 46 to the underside in FIG. 5B via the circuit patterns 43a and 43b, the insulating board 42, and the metal plate 44 to dissipate the heat. The thickness of the circuit patterns 43a through 43c is preferably greater than or equal to 0.1 mm and smaller than or equal to 1 mm. The thickness of the circuit patterns 43a through 43c is more preferably greater than or equal to 0.2 mm and smaller than or equal to 0.5 mm.

For example, the semiconductor chip 45 includes a switching element such as an IGBT or a power MOSFET. For example, the semiconductor chip 45 has an input electrode (drain electrode or a collector electrode) as a main electrode on the back surface and has a control electrode (gate electrode) and an output electrode (source electrode or an emitter electrode) as a main electrode on the front surface. The back surface of the semiconductor chip 45 is bonded to a circuit pattern 43a or 43b with solder (not illustrated). For example, the semiconductor chip 46 includes a diode such as an SBD or an FWD. The semiconductor chip 46 has an output electrode (cathode electrode) as a main electrode on the back surface and has an input electrode (anode electrode) as a main electrode on the front surface. The back surface of the semiconductor chip 46 is bonded to a circuit pattern 43a or 43b with solder (not illustrated).

Figure 6:
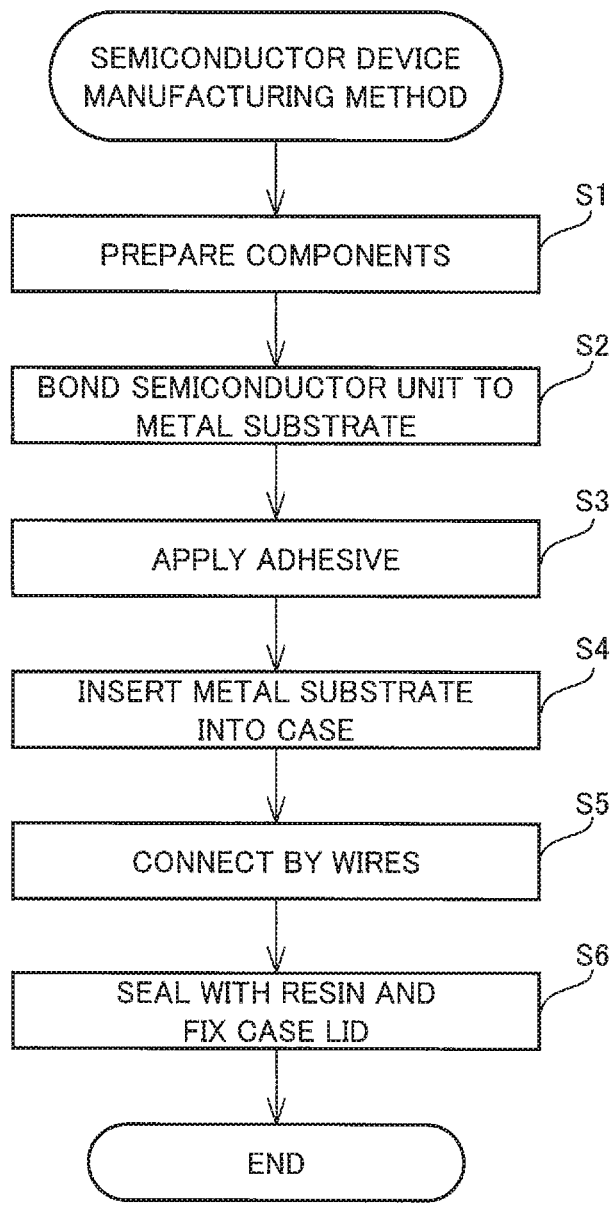
FIG. 6 is a view for describing a method for manufacturing the semiconductor device according to the embodiment.
Figure 7A:
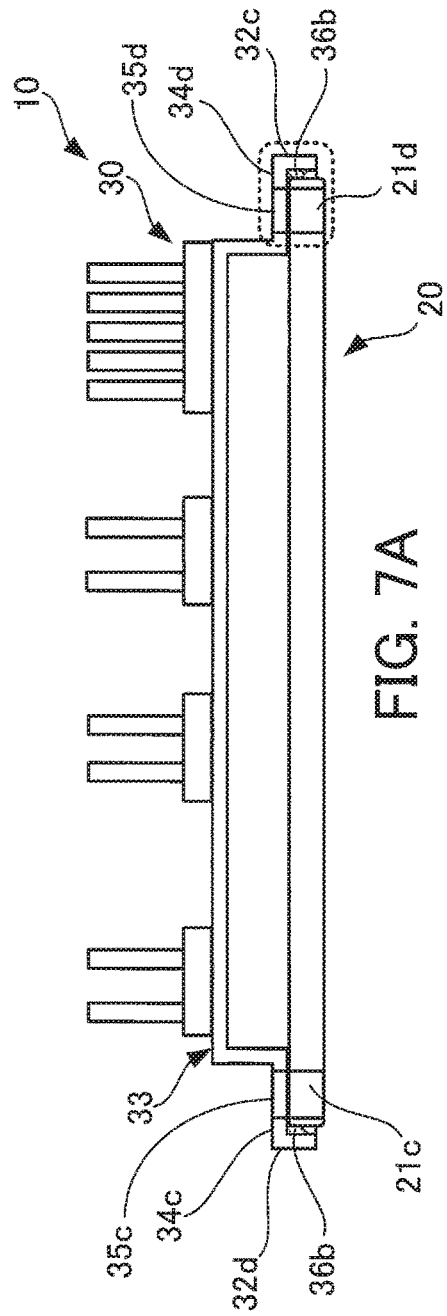
FIGS. 7A and 7B are views for describing the insertion of the metal substrate into the case of the semiconductor device according to the embodiment.
Figure 7B:
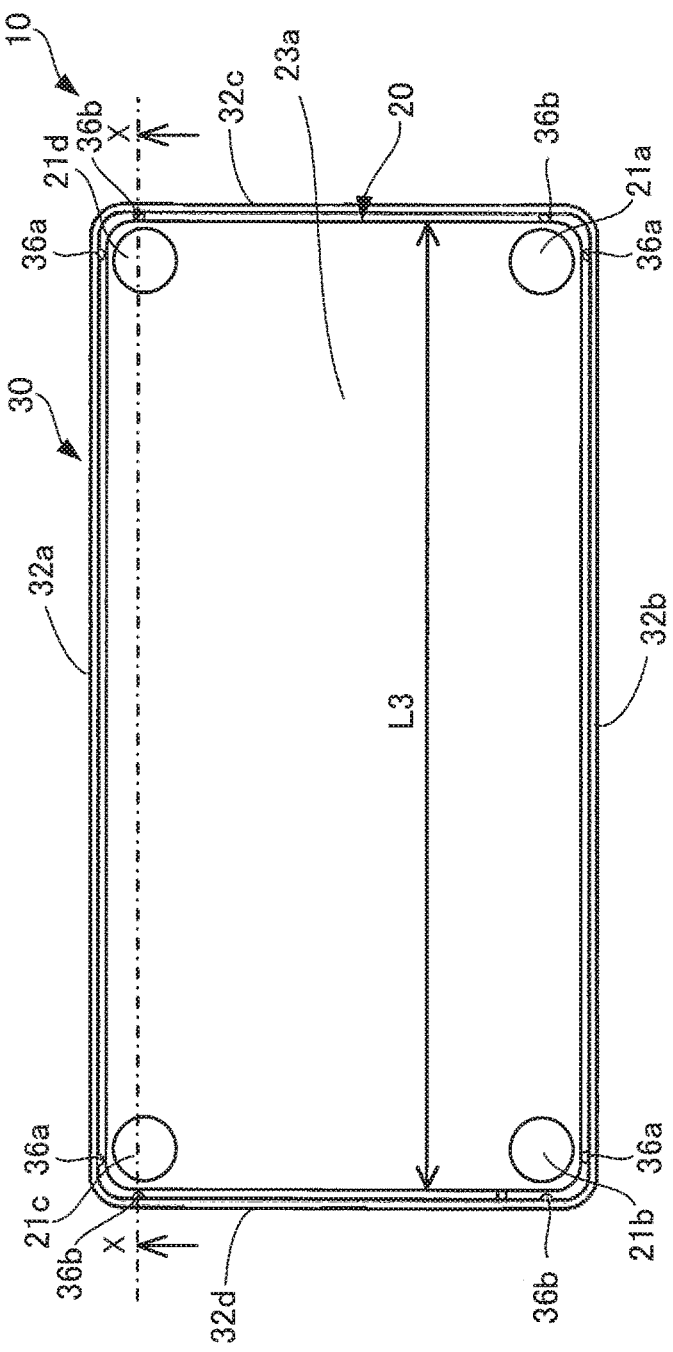
Figure 8:
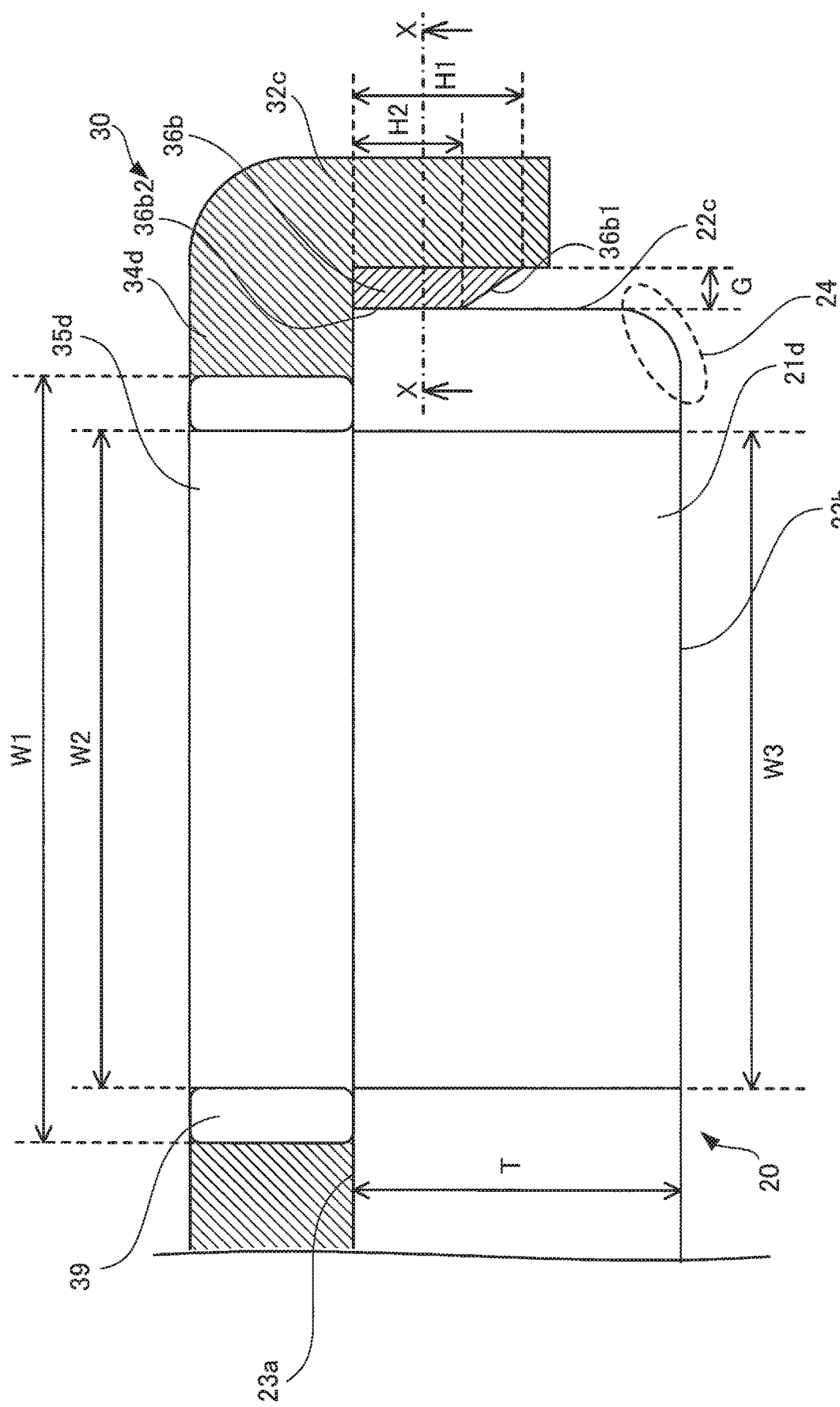
FIG. 8 is a sectional view of the case having the metal substrate inserted therein in the semiconductor device according to the embodiment.

A method for manufacturing the above semiconductor device 10 will now be described with reference to FIGS. 6 through 8. FIG. 6 is a view for describing a method for manufacturing the semiconductor device according to the embodiment. FIGS. 7A and 7B are views for describing the insertion of the metal substrate into the case of the semiconductor device according to the embodiment. FIG. 7A is a sectional view taken along the dot-dash line X-X of FIG. 7B. FIG. 7B is a plan view of the back surface of the semiconductor device 10. FIG. 8 is a sectional view of the case having the metal substrate inserted therein in the semiconductor device according to the embodiment. FIG. 8 is an enlarged view of the area enclosed by the broken line in FIG. 7A.

First, components of the semiconductor device 10, such as the metal substrate 20, the case 30, and the semiconductor unit 40, are prepared (step S1). Next, the semiconductor unit 40 is bonded to a determined area of the front surface 23a of the metal substrate 20 with solder (not illustrated) therebetween (step S2). At this time the quantity of the semiconductor units 40 bonded is determined to meet needs. Next, an adhesive is applied to either or both of the periphery of the back surfaces of the sidewall portions 32a through 32d of the case 30 and an outer peripheral edge of the metal substrate 20 to which the semiconductor unit 40 is bonded (step S3).

Next, as illustrated in FIGS. 7A and 7B, the metal substrate 20 is inserted into a housing area 31 surrounded by the sidewall portions 32a through 32d of the case 30 (step S4). In FIGS. 7A and 7B, the semiconductor unit 40 bonded to the metal substrate 20 is not illustrated. The metal substrate 20 may be press-fitted into the housing area 31 of the case 30. As described in FIGS. 3A and 3B, for example, the distance L1 between the sidewall portions 32c and 32d is longer than the distance L2 between the protrusions 36b in the case 30. The length L3 in the long side direction of the metal substrate 20 before press-fitting is made shorter than the distance L1 and is made longer than the distance L2 (distance L1>length L3>distance L2). (distance L1−distance L2) is preferably greater than 0 mm and smaller than or equal to 0.6 mm. (distance L1−distance L2) is more preferably greater than 0 mm and smaller than or equal to 0.3 mm. Furthermore, (distance L1−length L3) is preferably greater than 0 mm and smaller than or equal to 0.6 mm. (distance L1−length L3) is more preferably greater than 0 mm and smaller than or equal to 0.3 mm. In addition, (length L3−distance L2) is preferably greater than 0 mm and smaller than or equal to 0.6 mm. (length L3−distance L2) is more preferably greater than 0 mm and smaller than or equal to 0.3 mm. The same relationship exists between the length (not illustrated) in the short side direction of the metal substrate 20 and distances in the case 30. The sides 22a through 22d of the metal substrate 20 press-fitted into the case 30 are reliably held at points with high position accuracy by the protrusions 36a and 36b formed on the sidewall portions 32a through 32d of the case 30. That is to say, there is a gap between each side 22a through 22d of the metal substrate 20 and its corresponding sidewall portion 32a through 32d of the case 30. The adhesive (not illustrated) enters the gap. As a result, the adhesive of sufficient thickness ensures reliably attaching the metal substrate 20 to the case 30.

Furthermore, there is a possibility that the metal substrate 20 is not press-fitted into the housing area 31 of the case 30. That is to say, the metal substrate 20 may simply be fitted into the housing area 31 with the protrusions 36a and 36b. As described in FIGS. 3A and 3B, the distance L1 between the sidewall portions 32c and 32d is longer than the distance L2 between the protrusions 36b in the case 30. If the metal substrate 20 is not press-fitted into the housing area 31, then the length L3 in the long side direction of the metal substrate 20 is naturally shorter than the distance L1. Furthermore, the length L3 in the long side direction of the metal substrate 20 is made equal to or shorter than the distance L2 (distance L1>distance L2≥length L3). (distance L1−distance L2) is preferably greater than 0 mm and smaller than or equal to 0.6 mm. (distance L1−distance L2) is more preferably greater than 0 mm and smaller than or equal to 0.3 mm. In addition, (distance L2−length L3) is preferably greater than or equal to 0 mm and smaller than or equal to 0.6 mm. (distance L2−length L3) is more preferably greater than or equal to 0 mm and smaller than or equal to 0.3 mm. The same relationship exists between the length (not illustrated) in the short side direction of the metal substrate 20 and distances in the case 30. The sides 22a through 22d of the metal substrate 20 inserted in this way into the case 30 are supported at points with high position accuracy by the protrusions 36a and 36b formed on the sidewall portions 32a through 32d of the case 30. That is to say, there is a gap between each side 22a through 22d of the metal substrate 20 and its corresponding sidewall portion 32a through 32d of the case 30. The adhesive (not illustrated) enters the gap. As a result, the adhesive of sufficient thickness ensures reliably attaching the metal substrate 20 to the case 30.

Furthermore, the ring hole areas 34a through 34d (FIG. 7A illustrates the ring hole areas 34c and 34d of the ring hole areas 34a through 34d) of the coating portion 33 of the case 30 keep the position in the depth direction of the inserted metal substrate 20 relative to the housing area 31 of the case 30. In addition, the ring holes 35a through 35d (FIG. 7A illustrates the ring holes 35c and 35d of the ring holes 35a through 35d) made in the ring hole areas 34a through 34d are in proximity to the fixing holes 21a through 21d (FIGS. 7A and 7B illustrate the fixing holes 21c and 21d of the fixing holes 21a through 21d), respectively, of the metal substrate 20.

The details of the fixing holes 21a through 21d of the metal substrate 20 and the ring holes 35a through 35d of the case 30 at this time will be described further with reference to FIG. 8 with the fixing hole 21d and the ring hole 35d as examples. The following is true with the other fixing holes 21a through 21c and ring holes 35a through 35c. FIG. 8 illustrates a case where a metal ring 39 having a diameter of W2 is fitted into the ring hole 35d made in the case 30 and having a diameter of W1 (>W2). As stated above, the metal substrate 20 is inserted into the housing area 31 of the case 30. The protrusion 36b has a taper 36b1 formed on the side facing the back surface of the semiconductor device 10 and a flat portion 36b2 extending from the taper 36b1 on the side facing the housing area 31. Accordingly, the metal substrate 20 is easily inserted into the housing area 31 by the taper 36b1 of the protrusion 36b and is pressed by the flat portion 36b2 in parallel with a principal plane of the metal substrate 20. At this time a gap G between the side 22c of the metal substrate 20 and the sidewall portion 32c of the case 30 is greater than or equal to 0.05 mm and smaller than or equal to 0.9 mm. The gap G is preferably greater than or equal to 0.05 mm and smaller than or equal to 0.5 mm. The gap G is more preferably greater than or equal to 0.15 mm and smaller than or equal to 0.3 mm. The vertical height H1 of the protrusion 36b is preferably greater than or equal to 0.8 mm and smaller than or equal to 4.5 mm. For example, the vertical height H1 of the protrusion 36b is greater than or equal to 1.8 mm and smaller than or equal to 2 mm. The vertical height H2 of the flat portion 36b2 of the protrusion 36b is preferably greater than or equal to 0.5 mm and smaller than or equal to 2.5 mm. For example, the vertical height H2 of the flat portion 36b2 of the protrusion 36b is greater than or equal to 0.9 mm and smaller than or equal to 1.1 mm. Furthermore, as stated above, the thickness T of the metal substrate 20 is preferably greater than or equal to 1 mm and smaller than or equal to 5 mm. For example, the thickness T of the metal substrate 20 is greater than or equal to 2.8 mm and smaller than or equal to 3.2 mm. The metal substrate 20 is inserted in this way into the housing area 31 of the case 30 and is reliably fixed. At this time the metal substrate 20 is inserted so that a dull surface 24 will be the back surface 23b. A surface opposite the dull surface 24 of the metal substrate 20 becomes the front surface 23a. As a result, the side 22c of the metal substrate 20 is reliably fixed to the protrusion 36b and the front surface 23a is reliably in contact with the ring hole area 34d. Furthermore, alignment is performed between the fixing hole 21d of the metal substrate 20 having a diameter of W3 and the ring hole 35d of the case 30. Accordingly, even if there are restrictions on the external size of the metal substrate 20 or the position of the fixing hole 21d made in the metal substrate 20 and the diameter W3 of the fixing hole 21d made in the metal substrate 20 is not made rather large, alignment is properly performed between the fixing hole 21d and the ring hole 35d of the case 30. As a result, a target effective hole diameter is ensured. In this case, an effective hole diameter is the diameter W2 or W3. If the target effective hole diameter is obtained, then deviation between the fixing hole 21d and the ring hole 35d is permitted. For example, it is assumed that the diameters W2 and W3 are 5.5 mm in FIG. 8. Then an effective hole diameter is obtained if the diameters W2 and W3 are in the range of 5.5 mm±0.3 mm.

Furthermore, with the semiconductor device 10 the protrusions 36a are formed on parallel portions of the sidewall portions 32a and 32b opposed to each other in plan view with the ring hole 35d therebetween. In addition, the protrusions 36b are formed on parallel portions of the sidewall portions 32c and 32d opposed to each other with the ring hole 35d therebetween. By doing so, alignment is performed with accuracy between the fixing hole 21d of the metal substrate 20 and the ring hole 35d of the case 30 even if the metal substrate 20 warps or undulates. Moreover, the semiconductor device 10 having the metal substrate 20 inserted in this way is fixed to an external device by screwing a screw into the ring hole 35d and the fixing hole 21d and generates heat as a result of driving the semiconductor unit 40. Because the metal substrate 20 and the semiconductor unit 40 differ in thermal expansion coefficient, the generated heat causes a warp of the metal substrate 20. In particular, the ring hole 35d and the fixing hole 21d in the semiconductor device 10 are fixed by the screw. As a result, stress concentrates in a portion around the ring hole 35d and the fixing hole 21d. Accordingly, with the semiconductor device 10 the protrusions 36a are formed on the parallel portions of the sidewall portions 32a and 32b opposed to each other in plan view with the ring hole 35d therebetween. In addition, the protrusions 36b are formed on the parallel portions of the sidewall portions 32c and 32d opposed to each other with the ring hole 35d therebetween. The metal substrate 20 inserted is reliably fixed by the protrusions 36a and 36b formed in this way.

Next, elements in each semiconductor unit 40 over the metal substrate 20 are electrically connected by wires (not illustrated) and the semiconductor units 40 over the metal substrate 20 are electrically connected by wires (not illustrated) (step S5). These wires are made of metal, such as aluminum, copper, or an alloy containing at least one of them, having good conductivity. Furthermore, it is desirable that the diameter of the wires be greater than or equal to 100 μm and smaller than or equal to 1 mm. Next, a sealing member (not illustrated) is injected from the aperture portion 37 of the case 30 to seal the semiconductor unit 40, the wires, and the like in the case 30 (step S6). The sealing member is silicone gel, epoxy resin, or the like. After the sealing is performed in this way, the aperture portion 37 of the case 30 is covered with the case lid 38. Alternatively, the following method may be used. The case 30 is filled with the sealing member to the aperture portion 37, the sealing member is exposed from the aperture portion 37, and the exposed sealing member is solidified. The semiconductor device 10 is also obtained by this method. In this case, the case lid 38 is not used.

Figure 9:
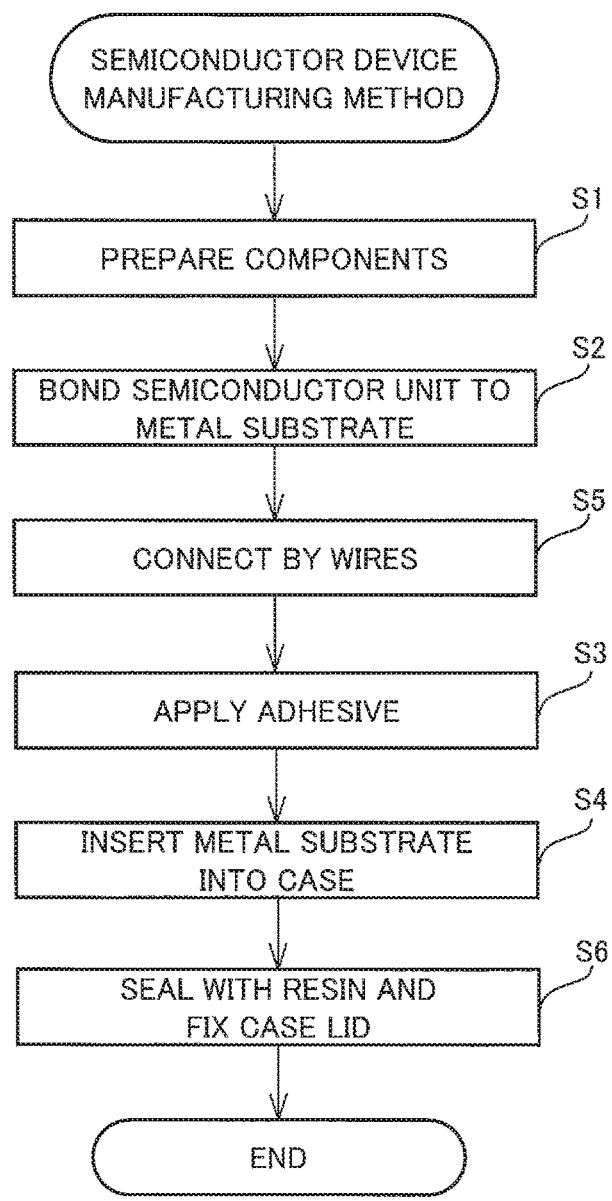
FIG. 9 is a view for describing another method for manufacturing the semiconductor device according to the embodiment (part 1)
Figure 10:
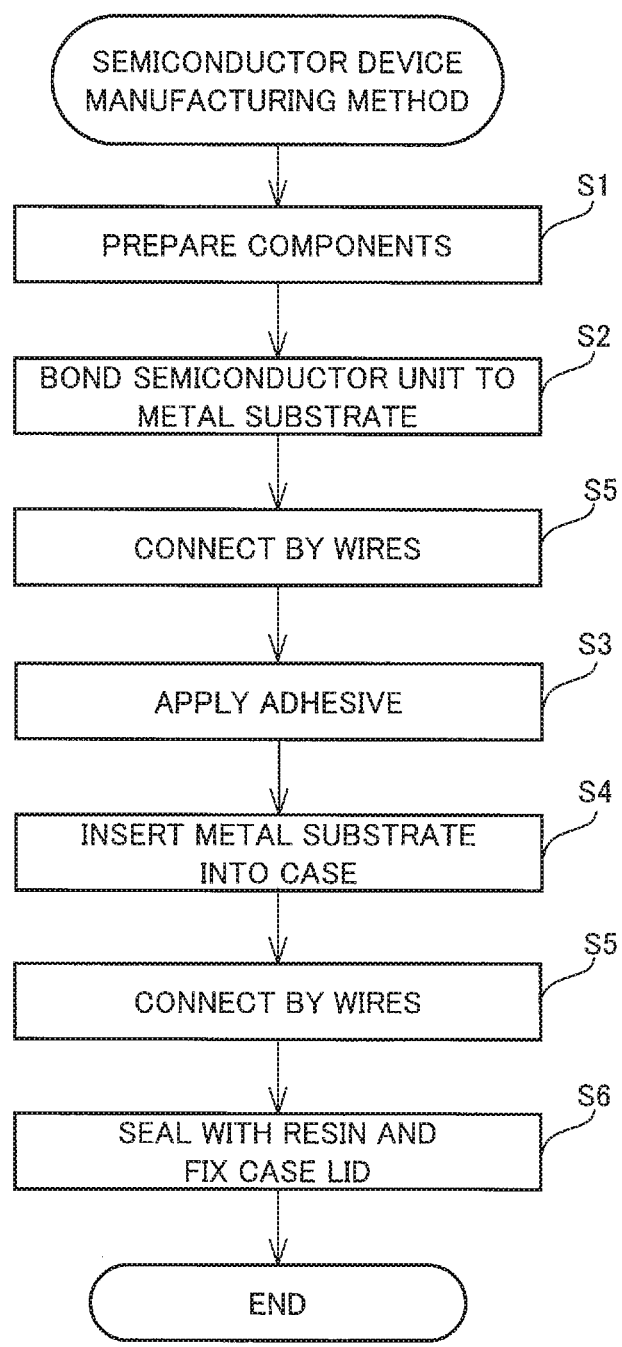
FIG. 10 is a view for describing still another method for manufacturing the semiconductor device according to the embodiment (part 2)

Furthermore, the above method for manufacturing the semiconductor device 10 is taken as an example. Another method for manufacturing the semiconductor device 10 will be described with reference to FIGS. 9 and 10. FIGS. 9 and 10 are views for describing other methods for manufacturing the semiconductor device according to the embodiment. Steps in FIGS. 9 and 10 which are the same as those in FIG.

6 are marked with the same step numbers and detailed descriptions of them will be omitted. First, as illustrated in FIG. 9, step S5 in which wire connection is performed may be performed after steps S1 and S2, and then steps S3, S4, and S6 may be performed. Alternatively, as illustrated in FIG. 10, step S5 in which wire connection is performed is performed after steps S1 and S2. In this step S5, however, only some of the elements in each semiconductor unit 40 over the metal substrate 20 or only some of the semiconductor units 40 over the metal substrate 20 are electrically connected by wires. After that, step S5 is performed again after steps S3 and S4. In this step S5, the rest of the elements in each semiconductor unit 40 over the metal substrate 20 and the rest of the semiconductor units 40 over the metal substrate 20 are electrically connected by wires. Finally step S6 is performed. The semiconductor device 10 is also obtained by these methods. In the above methods, the elements in each semiconductor unit 40 over the metal substrate 20 and the semiconductor units 40 over the metal substrate 20 are electrically connected by the wires (not illustrated). However, the elements in each semiconductor unit 40 over the metal substrate 20 and the semiconductor units 40 over the metal substrate 20 may be electrically connected by conductive wiring members such as ribbons or lead frames.

The above semiconductor device 10 includes the flat-plate metal substrate 20 which is rectangular in plan view and which has the through fixing holes 21a through 21d in the periphery and the case 30. The case 30 has the sidewall portions 32a through 32d which surround the sides 22a through 22d of the metal substrate 20 along the sides 22a through 22d and the coating portion 33 which covers the front surface 23a of the metal substrate 20 surrounded by the sidewall portions 32a through 32d and which has the through ring holes 35a through 35d corresponding to the fixing holes 21a through 21d respectively. With the semiconductor device the protrusions 36a and 36b are formed on the inner surfaces of the sidewall portions 32a through 32d opposed to one another in plan view with the ring holes 35a through 35d therebetween. The metal substrate 20 is inserted in this way into an area of the case 30 surrounded by the sidewall portions 32a through 32d and is reliably fixed. Furthermore, alignment is performed with accuracy between each fixing hole 21a through 21d of the metal substrate 20 inserted in this way and its corresponding ring hole 35a through 35d, respectively, of the case 30. With the above semiconductor device 10 the case where the semiconductor unit 40 is bonded to the metal substrate 20 with solder is described as an example. However, the following case is possible. An insulating board and a circuit pattern are formed in order over the metal substrate 20 and a semiconductor chip is bonded to the circuit pattern in place of the semiconductor unit 40.

An effect equal to or greater than the above effect is obtained by changing a position at which each protrusion is formed, the shape of each protrusion, or the like in the above semiconductor device 10. Some modifications of the semiconductor device 10 will now be described.

First Modification

Figure 11:
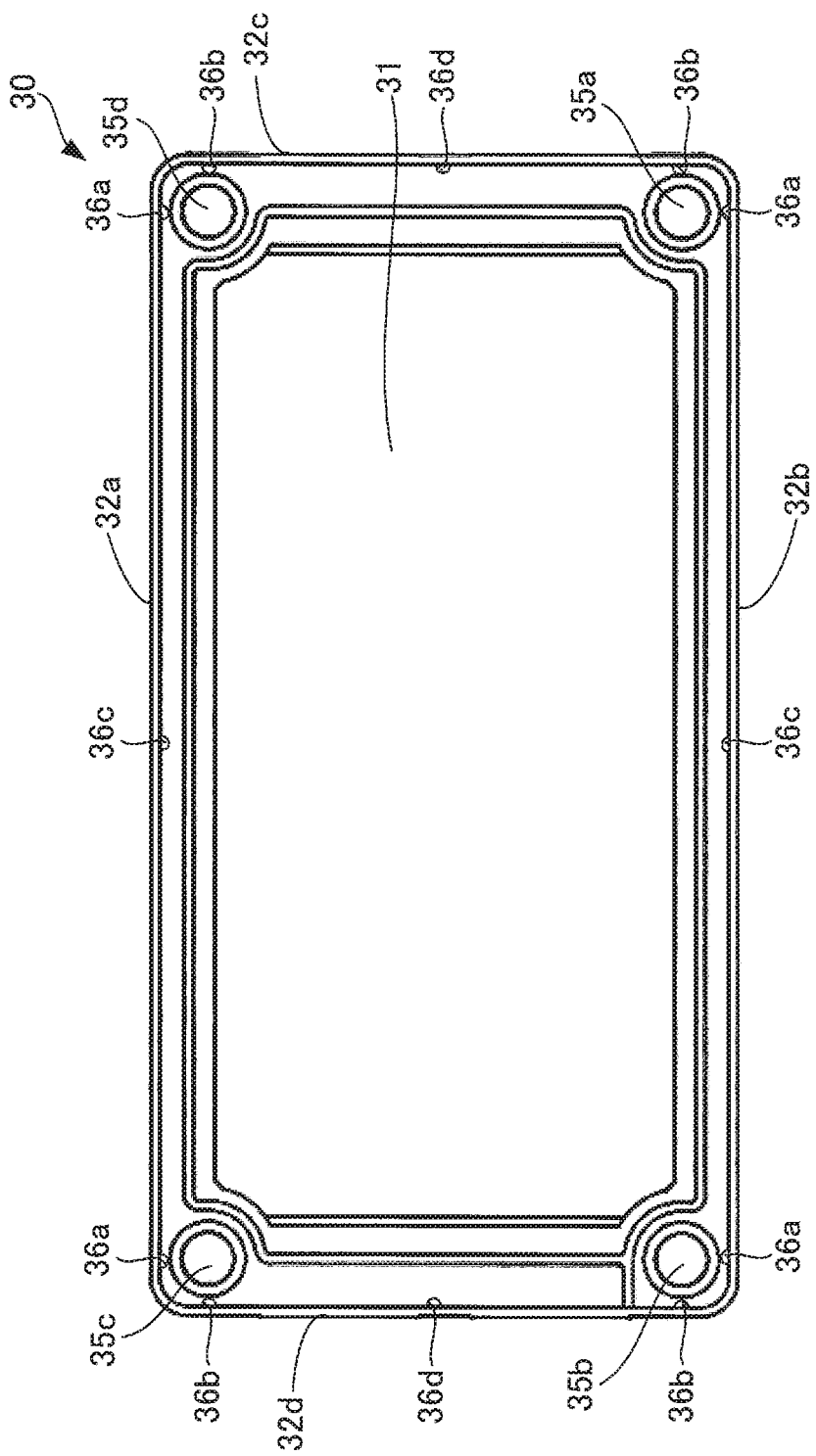
FIG. 11 is a view of a case included in a semiconductor device according to a first modification.

In a first modification, a case where protrusions 36c and 36d are also formed between the protrusions 36a and between the protrusions 36b on the sidewall portion 32a through 32d of the case 30 of the semiconductor device 10 will be described with reference to FIG. 11. FIG. 11 is a view of a case included in a semiconductor device according to the first modification. FIG. 11 illustrates the back surface of a case 30. The protrusions 36c and 36d formed in this way on approximately central portions between protrusions 36a and between protrusions 36b in the sidewall portions 32a through 32d of the case 30 support central portions of sides 22a through 22d of a metal substrate 20 inserted. Accordingly, alignment is performed with accuracy between a fixing hole 21d of the metal substrate 20 and a ring hole 35d of the case 30 even if the metal substrate 20 warps or undulates. Furthermore, even if central portions of a front surface 23a and a back surface 23b of the metal substrate 20 significantly warps upward convexly or downward convexly due to heat generated as a result of driving a semiconductor unit 40, the metal substrate 20 is fixed by the protrusions 36c and 36d.

Second Modification

In a second modification, a case where two fixing holes and two ring holes are made in a semiconductor device 10 according to the specification, design, or the like will be described with reference to FIGS. 12A and 12B. FIGS. 12A and 12B are views of a case and a metal substrate included in a semiconductor device according to the second modification. FIG. 12A illustrates the back surface of a case 30a. FIG. 12B illustrates the front surface 23a of a metal substrate 20a. Ring holes 35e and 35f opposed to each other with an aperture portion 37 therebetween are made in a coating portion 33 of the case 30a of the second modification near central portions of sidewall portions 32c and 32d respectively. On the other hand, fixing holes 21e and 21f corresponding to the ring holes 35e and 35f, respectively, of the case 30a are also made in the metal substrate 20a. In this case, protrusions 36a and 36b are also formed on parallel portions of the inner surfaces of the sidewall portions 32a through 32d of the case 30a opposed to one another in plan view with the ring holes 35e and 35f therebetween. For example, the protrusions 36a are formed on the sidewall portions 32a and 32b opposed to each other with the ring hole 35e therebetween. The protrusions 36b are formed on the sidewall portions 32c and 32d opposed to each other with the ring hole 35e therebetween. As stated above, the protrusions 36a and 36b are formed on the parallel areas of the sidewall portions 32a through 32d opposed to one another in plan view with the ring holes 35e and 35f therebetween. Furthermore, in the second modification, it is assumed that the distance between the sidewall portions 32c and 32d opposed to each other is L1 and that the distance between the protrusions 36b opposed to each other is L2. Then (L1−L2)/2 is preferably greater than or equal to 0.05 mm and smaller than or equal to 0.5 mm. (L1−L2)/2 is more preferably greater than or equal to 0.15 mm and smaller than or equal to 0.3 mm. This is the same with FIGS. 3A and 3B. Moreover, (L1−L2)/2 may be greater than or equal to 1/20 time the thickness of sides 22a through 22d of the metal substrate 20 and smaller than or equal to 1/10 time the thickness of the sides 22a through 22d of the metal substrate 20. In addition, the same applies to the sidewall portions 32a and 32b opposed to each other and the protrusions 36a opposed to each other. Furthermore, in the case of the second modification, protrusions 36c may be formed between the protrusions 36a on the sidewall portions 32a and 32b of the case 30a. This is the same with the first modification. By doing so, alignment is performed with accuracy between each fixing hole 21e and 21f of the metal substrate 20a and its corresponding ring hole 35e and 35f of the case 30a even if the metal substrate 20a warps or undulates. Furthermore, even if central portions of the front surface 23a and back surface 23b of the metal substrate 20a significantly warp upward convexly or downward convexly due to heat generated as a result of driving a semiconductor unit 40, the metal substrate 20a is fixed by the protrusions 36c.

Third Modification

Figure 13A:
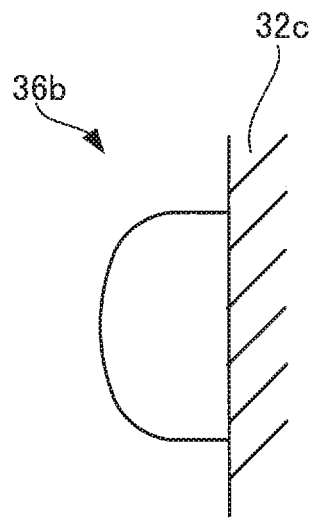
FIGS. 13A and 13B are views for describing a protrusion included in a semiconductor device according to a third modification.
Figure 13B:
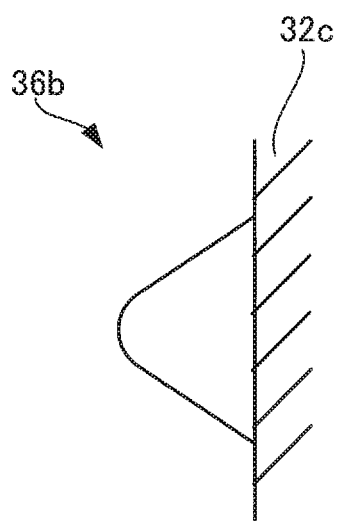

In a third modification, an example of the shape of protrusions will be described with reference to FIGS. 13A and 13B. FIGS. 13A and 13B are views for describing a protrusion included in a semiconductor device according to the third modification. For example, FIGS. 13A and 13B are sectional views taken along the dot-dash line X-X of FIG. 8. A protrusion 36b illustrated in FIG. 13A has the shape of a semicircle and has a curved surface on the side on which the protrusion 36b is in contact with a metal substrate 20. Furthermore, a protrusion 36b illustrated in FIG. 13B has the shape of a spire and the apex on the side on which the protrusion 36b is in contact with a metal substrate 20 has a curved surface. Such protrusions 36b allow the metal substrate 20 to easily enter a housing area 31, and the curved surfaces of the protrusions 36b support a side 22c of the metal substrate 20 at points. Furthermore, the metal substrate 20 is pressed in parallel with a principal plane of the metal substrate 20. The metal substrate 20 is inserted in this way into the housing area 31 of a case 30 and is reliably fixed with high position accuracy. The shape of protrusions 36a, 36c, and 36d may be the same as that of the protrusion 36b illustrated in FIG. 13A or 13B. The protrusion 36b illustrated in FIG. 13A or 13B is formed in the same way not only on a sidewall portion 32c of the case 30 but also on sidewall portions 32a, 32b, and 32d of the case 30.

According to the disclosed technique, alignment is performed with accuracy between a hole made in a case and a hole made in a metal substrate and an effective hole diameter of a fastening hole at fixing time is ensured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a flat-plate metal substrate having a rectangular shape in a plan view, and having a plurality of through fixing holes provided at a periphery thereof, the metal substrate having a front surface and a back surface opposite to the front surface; and
a case having a housing space in which the metal substrate is housed, and having:
a sidewall portion which is provided along each of side faces of the metal substrate so as to surround the metal substrate, the sidewall portion having a plurality of protrusions provided at an inner surface thereof that faces the metal substrate, and protruding from the inner surface toward the metal substrate for positioning of the metal substrate, two of the plurality of protrusions and a corresponding one of the fixing holes located therebetween being aligned in a line parallel to one of the side faces of the metal substrate; and
a coating portion which covers the metal substrate and which has a plurality of through ring holes at positions respectively corresponding to positions of the fixing holes.

2. The semiconductor device according to claim 1, wherein each of the side faces of the metal substrate is in contact with a corresponding one of the protrusions so as to define respective gaps between the side faces of the metal substrate and the sidewall portion.

3. The semiconductor device according to claim 2, wherein the gaps are each in a range of 0.05 mm to 0.9 mm.

4. The semiconductor device according to claim 2, wherein:
a first distance between one side to an other side facing each other of the sidewall portion of the case is greater than a second distance between two of the protrusions respectively provided on the inner surface of the one side and the other side of the sidewall portion, and
a difference between the first distance and the second distance is equal to or less than 0.6 mm.

5. The semiconductor device according to claim 4, wherein the second distance between the two of the protrusions is equal to or greater than a length of the metal substrate measured between the two of the protrusions.

6. The semiconductor device according to claim 5, wherein a difference between the second distance and the length of the metal substrate is in a range of 0 mm to 0.3 mm.

7. The semiconductor device according to claim 2, wherein the side faces of the metal substrate adhere to the sidewall portion of the case with an adhesive filling the gaps therebetween.

8. The semiconductor device according to claim 1, wherein a total length of the two protrusions protruding from the inner surface is equal to or less than 0.6 mm.

9. The semiconductor device according to claim 1, wherein each of the protrusions has a taper at a side facing the metal substrate.

10. The semiconductor device according to claim 1, wherein the back surface of the metal substrate includes a dull surface at a periphery thereof.

11. The semiconductor device according to claim 1, wherein
the fixing holes are respectively provided at each of four corners of the metal substrate, and
the ring holes are respectively provided in the coating portion at positions so as to correspond to the fixing holes.

12. The semiconductor device according to claim 1, wherein the protrusions include a central protrusion provided at one side of the sidewall portion between two sides that face each other and are orthogonal to the one side of the sidewall portion.

13. The semiconductor device according to claim 1, wherein
the fixing holes include a central fixing hole provided at the periphery of the metal substrate between two side faces of the metal substrate that face each other, and
the ring holes include a central ring hole provided in the coating portion at a position corresponding to the central fixing hole.

14. The semiconductor device according to claim 13, wherein the protrusions include two central protrusions protruding respectively from sides of the sidewall portion that are parallel to the two side faces of the metal substrate between which the central fixing hole is provided.

15. The semiconductor device according to claim 1, wherein
the protrusions each have a semicircle shape or a spire shape in a cross-sectional view parallel to the front surface of the metal substrate, and each include a curved surface at a side facing the metal substrate.

16. A method of manufacturing a semiconductor device, comprising:
preparing
a flat-plate metal substrate having a rectangular shape in a plan view, and having a plurality of through fixing holes provided at a periphery thereof; and
a case having a housing space therein, and including
a sidewall portion that is provided along each of side faces of the metal substrate so as to surround the metal substrate, the sidewall portion having a plurality of protrusions provided at an inner surface thereof that faces the metal substrate, and protrudes from the inner surface toward the metal substrate for positioning the metal substrate, two of the plurality of protrusions and a corresponding one of the fixing holes located therebetween being aligned in a line parallel to one of the side faces of the metal substrate; and
a coating portion which covers the housing space and which has a plurality of through ring holes; and
inserting the metal substrate into the housing space so that the protrusions support the side faces of the metal substrate.

17. The method of manufacturing a semiconductor device according to claim 16, wherein the inserting of the metal substrate into the housing space includes causing the side faces of the metal substrate to contact the protrusions so as to define respective gaps between the side faces of the metal substrate and the sidewall portion.

18. The method of manufacturing a semiconductor device according to claim 17, wherein the inserting of the metal substrate into the housing space includes press-fitting the metal substrate into the housing space, thereby holding the side faces of the metal substrate by at least two of the protrusions that face each other, between which the metal substrate is disposed.

19. The method of manufacturing a semiconductor device according to claim 18, wherein a distance between two of the protrusions respectively provided on one side and an other side of the sidewall portion is equal to or greater than a length of the metal substrate disposed between the two of the protrusions.

20. The method of manufacturing a semiconductor device according to claim 19, wherein a difference between the distance between the two of the protrusions and the length of the metal substrate is in a range of 0 mm to 0.3 mm.

* * * * *